(12) United States Patent
Richardson et al.

(10) Patent No.: US 6,611,946 B1
(45) Date of Patent: Aug. 26, 2003

(54) METHOD AND SYSTEM FOR AUTOMATIC GENERATION OF DRC RULES WITH JUST IN TIME DEFINITION OF DERIVED LAYERS

(75) Inventors: Guy R. Richardson, Cedar Park, TX (US); Dana M. Rigg, Austin, TX (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 09/419,833

(22) Filed: Oct. 14, 1999

(51) Int. Cl.[7] ............................................. G06K 17/50
(52) U.S. Cl. ........................................................ 716/5
(58) Field of Search ................................... 716/5, 6, 4

(56) References Cited

U.S. PATENT DOCUMENTS

| | | | | |
|---|---|---|---|---|
| 3,770,893 A | * | 11/1973 | Conerly | 379/124 |
| 5,590,049 A | * | 12/1996 | Arora | 716/5 |
| 5,613,102 A | * | 3/1997 | Chiang et al. | 716/5 |
| 5,963,454 A | * | 10/1999 | Dockser et al. | 716/18 |
| 6,061,696 A | * | 5/2000 | Lee et al. | 707/513 |
| 6,063,132 A | * | 5/2000 | DeCamp et al. | 716/5 |
| 6,097,884 A | * | 8/2000 | Sugasawara | 716/19 |
| 6,115,546 A | * | 9/2000 | Chevallier et al. | 716/1 |
| 6,301,691 B1 | * | 10/2001 | McBride | 716/5 |
| 6,378,110 B1 | * | 4/2002 | Ho | 716/5 |
| 6,397,373 B1 | * | 5/2002 | Tseng et al. | 716/5 |
| 6,425,113 B1 | * | 7/2002 | Anderson et al. | 716/5 |
| 6,434,723 B1 | * | 8/2002 | McBride et al. | 716/4 |

* cited by examiner

*Primary Examiner*—John F. Niebling
*Assistant Examiner*—Stacy A Whitmore
(74) *Attorney, Agent, or Firm*—Silicon Valley Patent Group LLP; Omkar K. Suryadevara

(57) ABSTRACT

Adding a layer of abstraction to the generation of a runset for DRC rules, by defining a meta language hides from the user the language of a specific verification tool (also called "native language"). The meta language can be used directly by the user to express in a file (also called "meta runset") the DRC rules to be used to create an input for the verification tool in the native language (also called simply "runset"). A runset generator uses DRC rules supplied by a user to generate a runset in a native language (that is identified by the user). The runset generator can use templates to generate a runset. Each template (also called "DRC template") contains code (can be in source form or in object form) for implementation of a DRC rule or derived layer in the native language of a specific verification tool (such as HERCULES). Thus implementation of DRC rules is hidden from the novice user. During automatic generation of DRC rules, the location in a runset of a derived layer specified by the user is optimized, by automatically inserting such a definition immediately prior to a DRC rule that uses the definition (also called "just in time" layer definition). Such just-in-time layer definition reduces memory usage of the verification tool, and ensures that unused physical layers or derived layers do not appear in the automatically generated runset.

23 Claims, 8 Drawing Sheets

Microfiche Appendix Included
(5 Microfiche, 409 Pages)

FIRST TOOL'S TEMPLATE LIBRARY

@ define CONNECT ($\ell$1, $\ell$2, output, comment)\
CONNECT $\ell$1 BY $\ell$2

125A

@ define WIDTH (layer, val,\output, comment)
\
INTERNAL layer {}\
COMMENT = comment\
SPACING < val\
NON_PARALLEL\
}output

124A

Nth TOOL'S TEMPLATE LIBRARY

@ define CONNECT (layer1, layer2, out, comment)\
COUPLE (layer1, layer2)

125N

@ define WIDTH (layer, value, out,\comment)
\
WIDTH_layer { value, out }

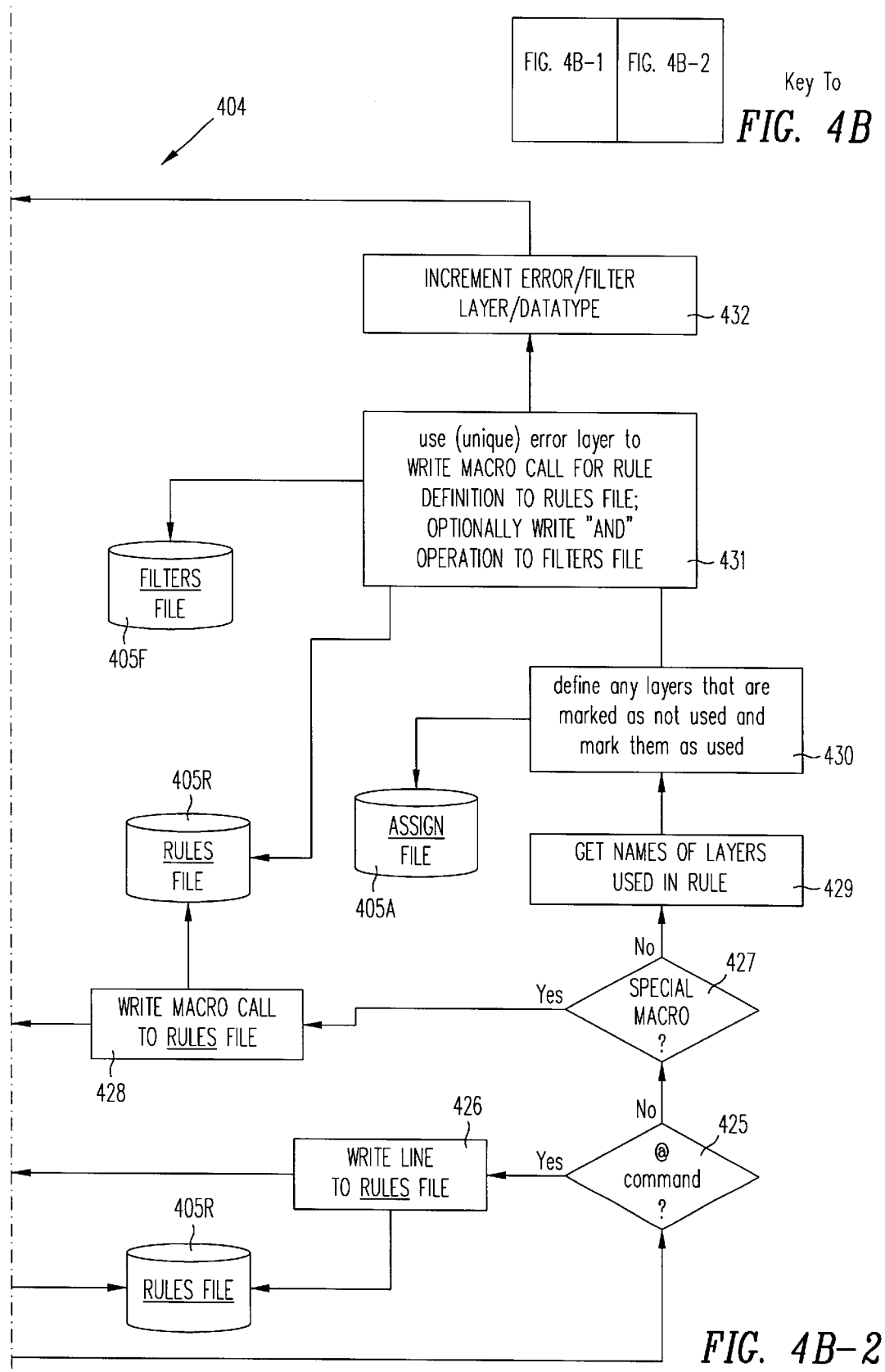

METHOD AND SYSTEM FOR AUTOMATIC GENERATION OF DRC RULES WITH JUST IN TIME DEFINITION OF DERIVED LAYERS

CROSS-REFERENCE TO RELATED APPLICATION

This application is related to and incorporates by reference herein in its entirety the concurrently filed, commonly owned U.S. patent application, Ser. No. 09/418,669 filed by Guy R. Richardson, et al., and entitled "Method And System For Using Unique Error And Filter Layers In Each DRC Rule".

CROSS-REFERENCE TO ATTACHED SOFTWARE APPENDIX

This patent application includes microfiche Appendix A which is part of the present disclosure, and which is incorporated by reference herein in its entirety. This Appendix consists of a total of 5 sheets and contains a total of 409 frames. Appendix A includes listings of computer programs and related data including source code in the languages C++ and Perl for implementing runset generator that automatically generates DRC rules in one embodiment of this invention a s described more completely below.

A portion of this patent document contains material which is subject to copyright protection. The copyright owner has no objection to the facsimile reproduction by anyone of the patent document or the patent disclosure, as it appears in the Patent and Trademark Office patent files or record, but othrwise reserves all copyright rights whatsoever.

BACKGROUND OF THE INVENTION

A computer programmed with appropriate software (called layout verification tool) is normally used to verify that a design of an integrated circuit (IC) chip conforms to certain predetermined tolerances that are required by a process to be used in fabricating the chip. Examples of such a layout verification tool include (1) HERCULES software available from Avant! Corporation, 46871 Bayside Parkway, Fremont, Calif. 94538, Tel 510.413.8000, and Web site www.avanticorp.com, (2) VAMPIRE software available from Cadence Design Systems, Inc, 555 River Oaks Parkway, San Jose, Calif. 95134, Tel 408.943.1234, and Web site www.cadence.com, and (3) CALIBRE software available from Mentor Graphics Corporation, 8005 SW Boeckman Road, Wilsonville, Oreg., 97070, Tel 503.685.7000, and Web site www.mentor.com.

Tolerances for the process that is to be used to fabricate the IC chip are often specified in the form of "rules" that are used by the layout verification tool to confirm that a chip's design can be manufactured by the process (in an operation called "design rule check" (DRC)). Examples of DRC rules to be used in checking an IC design include minimum width, minimum spacing between elements of a circuit, minimum width of notches, checks for acute angles and self-intersecting polygons, and enclosure and overlap checks. Such DRC rules can be applied to actual layers that are to be fabricated in the chip. Such DRC rules can also be applied to layers (called "derived layers") that are formed by logical operations (such as not, and, or, and xor) on actual or derived layers or some combination thereof, as described in, for example, pages 164–166 of a book entitled "Principles of CMOS VLSI Design, A Systems Perspective," second edition, by Neil H. E. Weste and Kamran Eshraghian, published by Addison-Wesley Publishing Company that is incorporated by reference herein in its entirety.

Such DRC rules may be supplied by the user through a graphical user interface (GUI), such as "composer" included in software called "dw-2000" available from Design Workshop Inc., 7405 Trans-Canada, Suite 320, St-Laurent, Québec, Canada H4T 1Z2, Web site www.designw.com. DRC rules are normally stored in a computer file commonly called a "runset" (also called "rule set." "rule file," "rule deck," or "rule scripts"). The runset is supplied as input to the layout verification tool to check if a design conforms to the DRC rules in the runset. The DRC rules are commonly expressed in a computer language that is specific to each layout verification tool (such as the "Standard Verification Rules Format" (SVRF) used by CALIBRE, as described at Web site www.mentor.com/calibre/datasheets/calibre/index.html). According to Mentor Graphics, an SVRF optimizing compiler automatically tunes the order and type of operations performed during verification. These optimizations include eliminating redundant steps and combining similar operations into parallel computations.

Moreover, Mentor Graphics states at the above-described web site that an "automatic rule deck converter" enables designers to get started right away, taking advantage of their existing rule decks. Such converters normally convert from the native language of one layout verification tool to the native language of another layout verification tool, thereby to allow the user to switch tools. Other such converters include utilities named A2drc (that translates the design rules from a Milkyway database to a Hercules DRC runset file) and A21vs (that translates netlist information from a Milkyway database to a Hercules LVS runset file) which are available in the HERCULES software (described above).

SUMMARY OF THE INVENTION

An approach in accordance with the invention adds a layer of abstraction to the generation of a runset for DRC rules, by defining a meta language that hides from the user the language of a specific verification tool (also called "native language"). The meta language can be used directly by the user to express in a file (also called "meta runset") the DRC rules to be used to create an input for the verification tool in the native language (also called simply "runset"). Alternatively the meta language can be built into a graphical user interface (GUI)) that receives information for the DRC rules from the user.

A runset generator in accordance with the invention (implemented by a suitably programmed computer) uses DRC rules supplied by a user to generate a runset in a native language (that is identified by the user). Use of such a runset generator enables an expert programmer who is knowledgeable about the native language to focus on difficult verification issues, while enabling a novice user who's ignorant of the native language to perform the majority of tasks related to runset development and maintenance.

In one embodiment, a runset generator uses templates to generate a runset. Each template (also called "DRC template") contains code (can be in source form or in object form) for implementation of a DRC rule or derived layer in the native language of a specific verification tool (such as HERCULES). Thus implementation of DRC rules is hidden from the novice user. Such DRC templates can be written in an industry-standard language (such as C or C++), and dynamically loaded into the runset generator at runtime, thereby providing the user with the ability to add any number of additional DRC templates (e.g. to define new rules, new types of derived layers, or new verification tools).

As noted above, DRC templates of the type described herein capture the expertise of the template author for use by numerous novice users who do not need to learn the native language of a verification tool. Specifically, once a library of DRC templates exists, it is possible for a user who is totally unfamiliar with the native language to generate a runset using the runset generator with the library. Therefore, novice users having only a limited knowledge of verification can still contribute to the development and maintenance of runsets.

Also, using DRC templates ensures a consistent coding style and implementation in the runset. A single DRC template may be used numerous times in one or more runsets that are generated by the runset generator. Also, in one implementation, a single DRC template (that is fixed) is used for the generation of multiple DRC rules in the native language, each rule in the native language differing only by the parameters provided to the rule.

Use of DRC templates simplifies runset maintenance. For example, suppose a more efficient approach for implementing a DRC rule is found. To incorporate the change for all meta runsets containing this DRC rule, simply update the DRC template and regenerate all the runsets. Therefore, copy/paste errors in the prior art (that result from manual creation of runsets) are eliminated, and all runsets benefit from the enhancement, because the runsets are recreated using the runset generator.

Moreover, use of DRC templates streamlines the overall methodology used for runset development. It is no longer necessary to endure lengthy review sessions reading runsets in the native language. Instead, code in the native language for implementation of a DRC rule is captured in the corresponding DRC template, and the DRC template need be reviewed only once. Any changes in the DRC rule in a meta runset need only be verified to ensure that the data being input to the DRC template is correct.

In another embodiment, during automatic generation of DRC rules, the location in a runset of a derived layer specified by the user is optimized, by automatically inserting such a definition immediately prior to a DRC rule that uses the definition (also called "just in time" layer definition). Such just-in-time layer definition reduces memory usage of the verification tool, and ensures that unused physical layers or derived layers do not appear in the automatically generated runset.

Note that the runset generator does not change the order of the DRC rules (although optimizing the order of layer definitions) thereby enabling a user to hierarchically structure the DRC rules in the meta runset in a manner most meaningful to the user. Such hierarchical structuring of rules in meta runsets enables the generation of native language runsets that are modular and contain only a portion of the complete set of DRC rules to be checked. These modular runsets simplify testing, and are also useful for reducing execution time of the verification tool when focusing on layout problems associated with violations of a small number of DRC rules.

BRIEF DESCRIPTION OF THE DRAWINGS

FIG. 3A illustrates examples of DRC rule templates having the same name included in template libraries for generating native code of two different tools in accordance with the invention.

DETAILED DESCRIPTION

Figure 1:
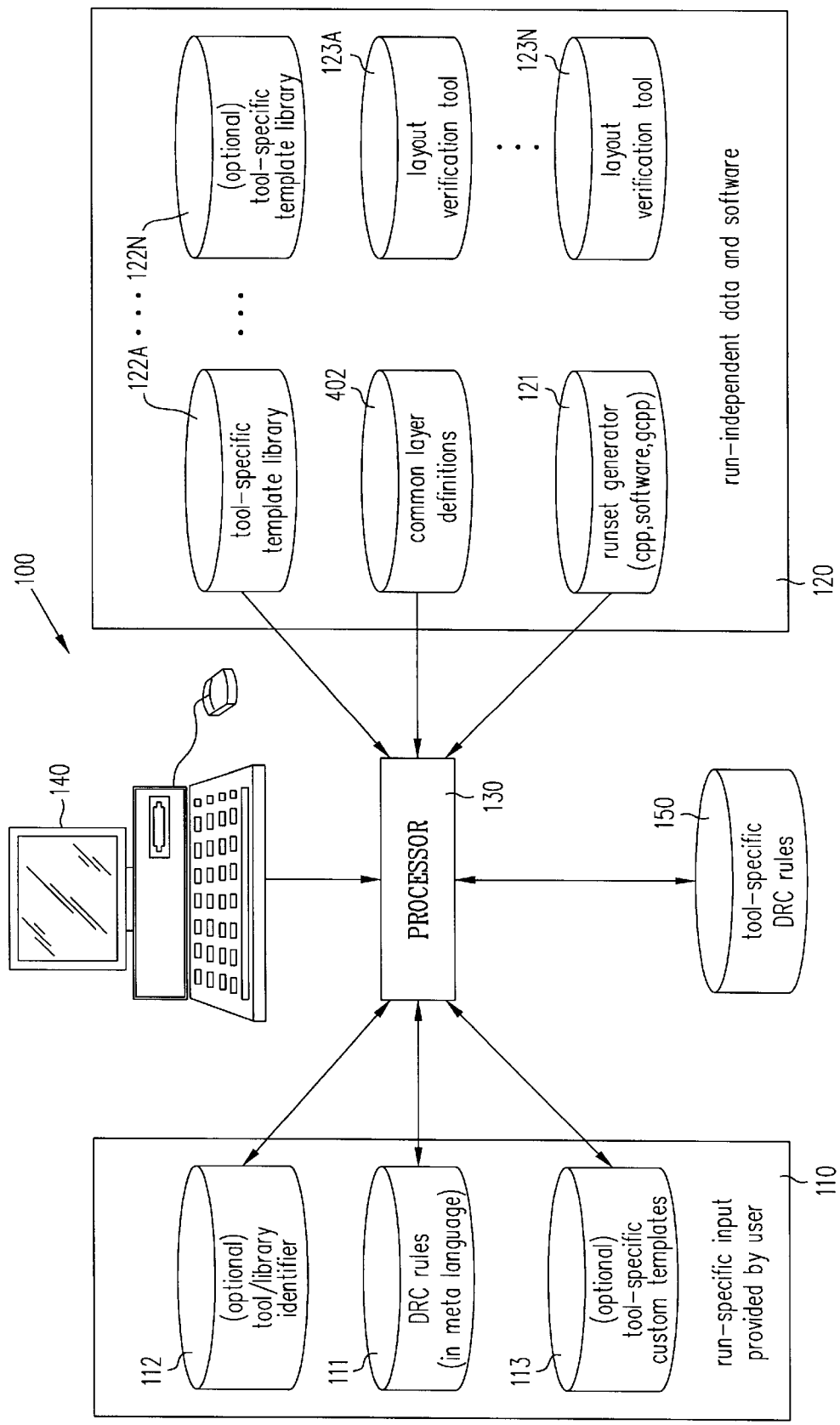
FIG. 1 illustrates, in a high level block diagram, a system for generating runsets for checking an IC design in accordance with the invention.

In accordance with the invention, instead of a user creating runsets in a language of a specific verification tool (also called "native language"), the user expresses the DRC rules 111 (FIG. 1) in a high level programming language (also called "meta language") that is independent of the native language. The meta language includes, in addition to normal constructs of the high level programming language, a set of keywords that identify DRC rules from an abstract viewpoint, unrelated to any native language. Such a meta language can cover several aspects of verification, including overall descriptive information (such as grid spacing), constructs for the creation of Boolean operations, descriptions of device formation for LVS, and constructs for the expression of rules. The meta language can be designed to conform with any high level programming language, such as C, C++, Perl or Tcl.

One prior art is implemented by categorizing DRC rules into several types, and templates (also called "DRC templates") are written for each type, using parameters to identify layers, values of tolerances, etc. to map each DRC rule in the meta language into one or more rules in the native language. In addition to or instead of the just-described method, in one embodiment rules in a specific native language can be divided up into groups that have some common feature, and a template written for each group of rules to allow any rule in the group to be generated by use of that template. Such a template contains a parameterized representation of each rule in the group (e.g. one or more parameters are used to identify a unique rule in the native language).

In one example, of the prior art a verification tool's native language uses the following keywords: m1space—keyword denotes metal 1 spacing, m1width—keyword denotes metal 1 width, m2space—keyword denoting metal 2 spacing, m2width—keyword denoting metal 2 width, m3space—metal 3 spacing, etc. In a meta language for the example, all these keywords are replaced by just two keywords: L1 space—keyword for checking spacing in any single layer, L1 width—keyword for checking width in any single layer, and the layer number is passed as a parameter to the template for translation into an appropriate keyword in the tool's native language.

In one embodiment of the invention, the above-described templates are grouped into one of a number of libraries 122A–122N (wherein $A \leq K \leq N$, N being the total number of such libraries), one each for a corresponding number of layout verification tools 123A–123N. The templates can be written in the above-described high level language to which the meta language conforms (for example, the templates can be written in C or C++). Therefore, templates in a library 122K can be in a macro language that is interpreted, or in a compiled language.

The templates are dynamically loaded into processor 130 (FIG. 1) when executing software (also called "runset generator") 121 that translates DRC rules in the meta language into instructions (also called "code") in the native language of a user-specified verification tool 123K. Note that the instructions generated by runset generator 121 by use of a template library 122K need not be limited to the native language of the verification tool, and instead can be macros that are then processed either by a preprocessor (such as gccp), or by the verification tool itself (such as HERCULES). This affords users of runset generator 121 maximum flexibility with respect to rule implementation. In one example, runset generator 121 is used with a set of templates that implement more than 75% of the rules commonly found in a Hercules DRC runset.

Figure 2:
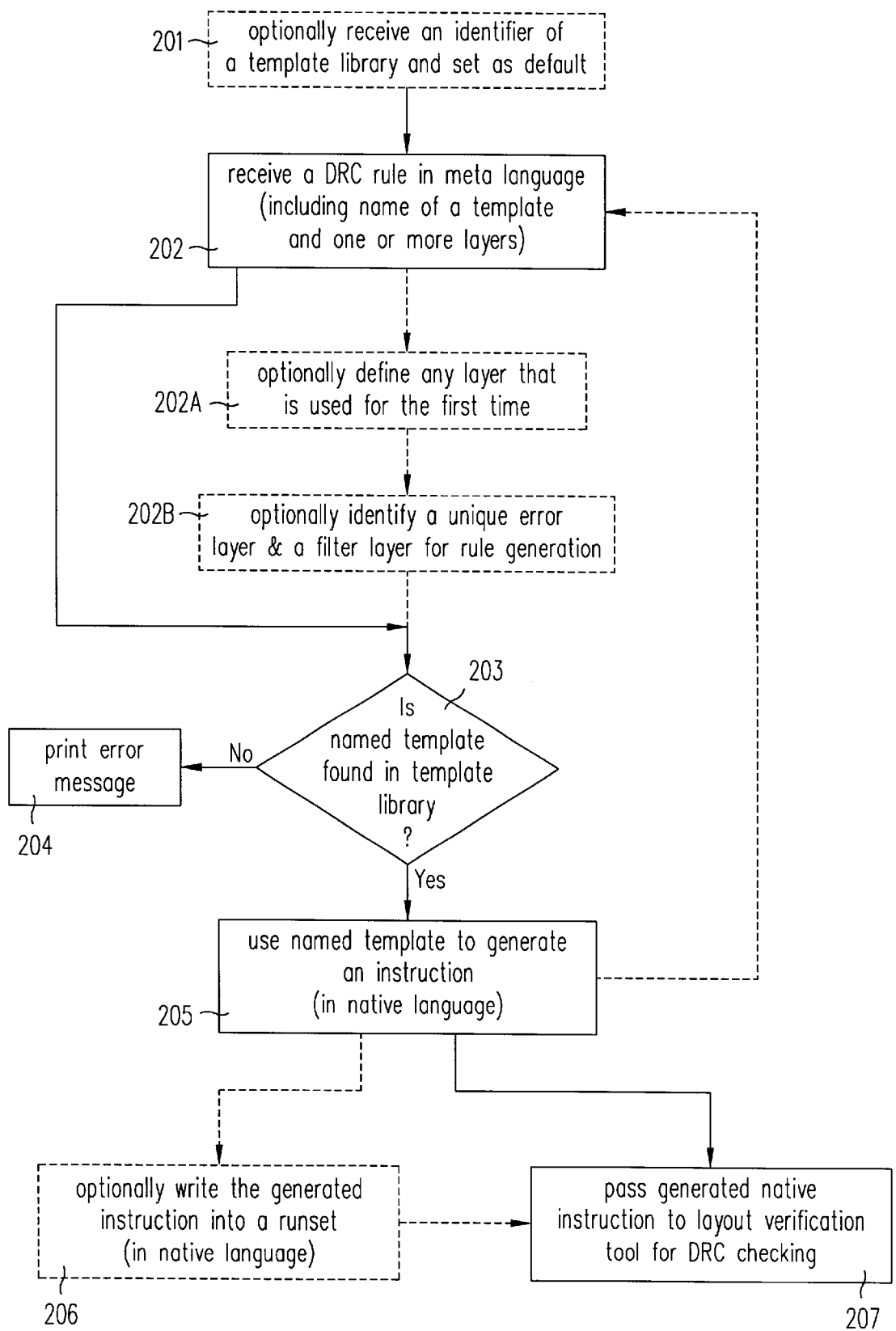
FIG. 2 illustrates, in a high level flow chart, operations performed by the system illustrated in FIG. 1.

If a number of tools 123A–123N are available to the user, the user identifies (see act 201 in FIG. 2) to processor 130 (FIG. 1), via an I/O device 140 a specific tool 123K (and therefore a specific native language) to be used to verify an IC design. Note that each of libraries 122A–122N includes templates for the same set of key words that are defined in the meta language, and therefore only one of these libraries needs to be selected by the user. For example, as illustrated in FIG. 3A, each of libraries 122A–122N includes a corresponding one of templates 124A–124N that defines the keyword "WIDTH," and another one of templates 125A–125N that defines the keyword "CONNECT."

Depending on the native language used by the respective tools 123A–123N, code generated by each template can be different: e.g. template 124A invokes an instruction "INTERNAL" that is specific to tool 123A, whereas template 124N invokes one of several instructions "WIDTH_1," "WIDTH_2," "WIDTH_3," "WIDTH_Z" that are specific to tool 123N. Therefore, processor 130 stores an identifier 112 (FIG. 1) of a tool specified by the user as a default for identifying a library of templates to be used in generation of a runset in the native language. Note that act 201 is an optional act that is not necessary, for example if the user has access to only one verification tool (which is then set up as the default).

Next, in act 202 (FIG. 2), runset generator 121 receives a DRC rule that has been specified by the user in the meta language. Information provided by the user to specify the DRC rule includes: a name of the template, the layer(s) on which the DRC check is to be applied, and values to be used in applying the DRC rule. Then, runset generator 121 searches (in act 203 of FIG. 2) template library 122K (that is the current default) for the template having the name that is received from the user, and if no such template is found, prints an error message (in act 204 of FIG. 2). On finding the template, runset generator 121 generates.(in act 205 of FIG. 2) an instruction in the native language of the default verification tool 123K. Thereafter, if there are additional DRC rules to be processed, runset generator 121 returns to act 202 (described above).

At some later point, the generated native language instructions are passed to the default verification tool 123K for performing the actual DRC checks on an IC design (that may be a simple test design, or an actual design). Depending on the implementation, the generated native language instructions may be first stored in an intermediate file (also called native language runset) 150 prior to passage to tool 123K. Also depending on the embodiment, instead of or in addition to act 201 (described above), runset generator 121 can optionally perform one or more of acts 202A and 202B between acts 202 and 203 (described above).

To summarize, the user specifies DRC rules in the meta language by specifying: (1) the name of a DRC template that contains an expression of the rule in the native language, (2) layers to which the rule applies, and (3) values associated with the rule. After specifying the DRC rules in the meta language, the user uses runset generator 121 to cause processor 130 to translate DRC rules 111 into the native language of a specific tool that the user plans to use for verification of an IC design.

In one implementation, runset generator 121 processes only one DRC rule at a time from a file of such rules expressed in the meta language (also called "meta runset"). Specifically, such a runset generator 121 reads each DRC rule, and then generates a rule in the native language based on one or more templates provided for that native language. Therefore, runset generator 121 maintains the order of DRC rules unchanged, thereby to allow the user to group the DRC rules in a meta runset 111 in a hierarchical fashion, to define modules that are meaningful to the user.

In an optional act 202A, runset generator 121, although maintaining the order of user-specified DRC rules, changes the order of layer derivations, by inserting definitions for derived layers immediately prior to the first use of a layer (also called "just-in-time" layer definition). Such just-in-time layer definition reduces memory usage of the verification tool 123K, and ensures that unused physical layers or derived layers do not appear in DRC runset 150 (FIG. 1) which contains code in the native language.

Figures 3B, 3C:
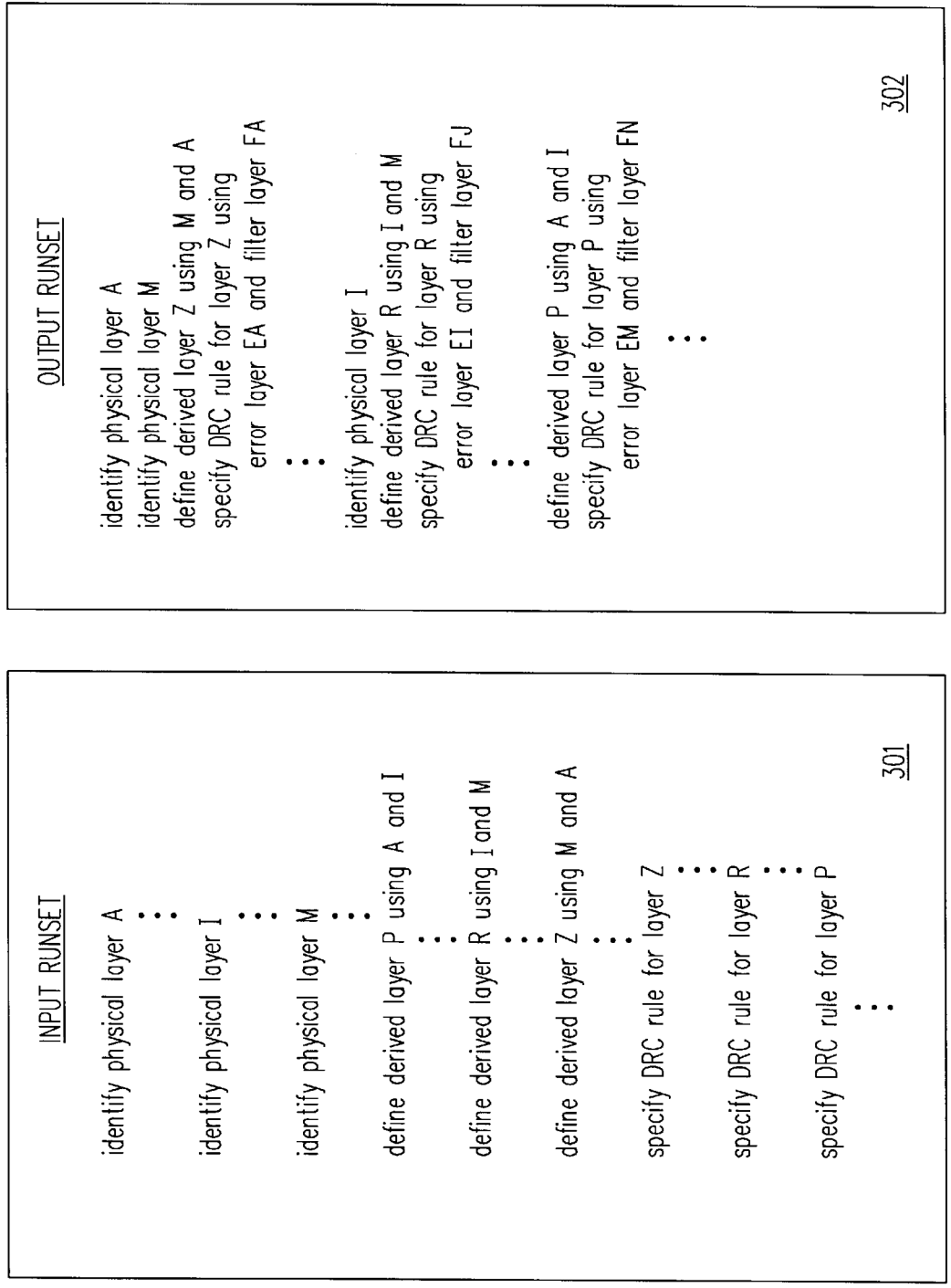
FIGS. 3B and 3C illustrate rearrangement of DRC rules from an input to an output file respectively resulting from performance of two operations, namely defining layers just-in-time, and identifying error and filter layers as illustrated in FIG. 2.

In one example illustrated in FIG. 3B, the user prepares an input runset 301 which is preferably, but not necessarily expressed in the meta language; in other embodiments runset 301 can be expressed in a native language, and the just-in-time layer definition is used just to re-arrange the lines; note that just-in-time layer definition can also be used in a converter that converts from one native language to another.

In the example, runset 301 is prepared in the following manner: the user first identifies a number of physical layers A . . . M (wherein $A \leq I \leq M$, M being the total number of physical layers), the user next defines a number of derived layers, M (wherein $P \leq R \leq Z$, Z being the total number of derived layers), the user then specifies a number of DRC rules. In this example, the DRC rules use the derived layers in the reverse order in which they were defined, e.g. the first DRC rule uses layer Z, and a later DRC rule uses layer R.

When input runset 301 is processed by just-in-time layer definition, there is nothing provided in the output runset 302 until the first DRC rule is read, and at that time, the use of layer Z in this DRC rule causes physical layers A and M to be first identified (because layer Z is derived from a logical operation on layers A and M), followed by definition of derived layer Z followed by specification of the first DRC rule. Next, when the DRC rule that uses layer R is read, the physical layer I is identified (because layer R is derived from a logical operation on layers I and M), followed by definition of derived layer R (as physical layer M is already identified). Then this DRC rule is specified in output runset 302.

Therefore, just-in-time layer definition defines derived layers just before they are used in a DRC rule. Note that just-in-time layer definition can be used even when the definition of a derived layer (also called "defined layer") is made early (followed by a number of DRC rules that are unrelated to the definition), as long as there is not an intervening definition of another derived layer prior to use of the defined layer in a DRC rule.

In act 202B, runset generator 121 specifies a unique number of an error layer to be used by tool 123K to indicate failure of a design to conform to a DRC rule applied to the layer. For example, when the first DRC rule is written to output runset 302, the specification of this rule includes an error layer EA which is a unique layer associated with only this first rule. Such allocation of a unique error layer ensures that errors found by a layout verification tool during performance of first DRC check are isolated (i.e. only errors from this first rule are reported in this error layer EA). In act 202B, if a test feature is to be used in the DRC check, for example to perform regression testing, runset generator 121 also specifies a unique number of a filter layer FA to be logically operated with error layer EA (e.g. logically ANDed), to uniquely identify failures caused only by the test feature (also called QA cell). The extent of filter layer FA is defined to cover only the test feature, so that errors caused by the test feature are isolated, and can be compared with a set of expected errors to confirm that the DRC check is operating correctly.

Figure 4A:
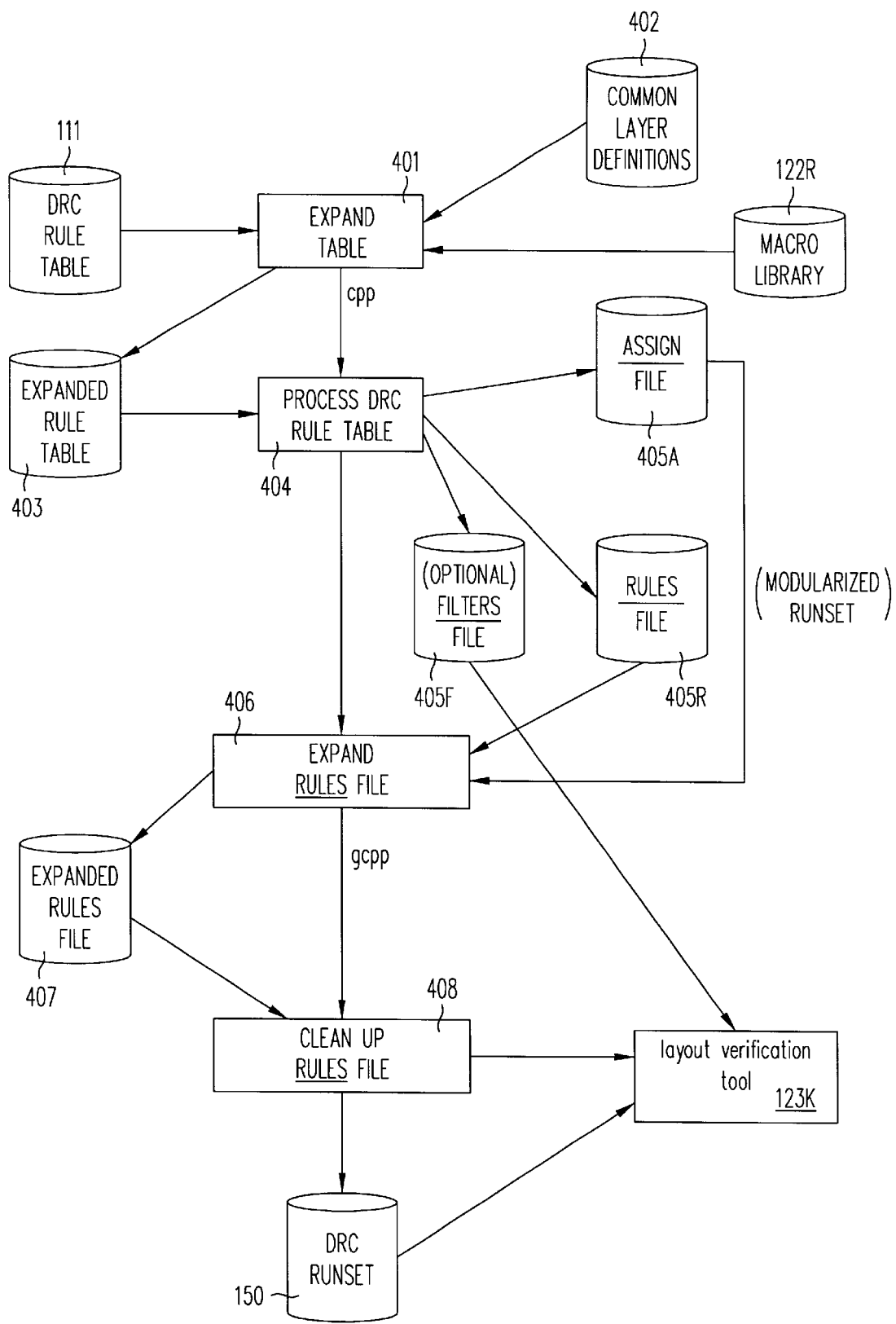
FIG. 4A illustrates in a high level block diagram, data flow in one exemplary implementation of the system illustrated in FIG. 1.

In one implementation of the type illustrated in the attached Appendix A, runset generator 121 includes use (as illustrated by act 401 in FIG. 4A) of the C++ language utility "cpp" (such as version 2.8.1 available from, for example Free Software Foundation, 59 Temple Place—Suite 330, Boston, Ma. 02111-1307, USA Email: gnu@gnu.org, Website:http://www.gnu.org, Voice: +1-617-542-5942, and Fax: +1-617-542-2652) to convert meta runset 111 into an expanded rule table 403. Such use is illustrated by invocation of the utility "make" (such as version 3.76.1 (1997) also available from the Free Software foundation), in the attached Appendix A, files AriesCode/src/Make.rules, AriesCode/src/Make.defines, AriesCode/src/Makefile.generic. In this implementation, meta runset 111 (e.g. see file "AriesCode/src/modules/demo/demo.table" in Appendix A) contains lines that contain the following fields (wherein each field is separated by commas, and elements within a field are separated by semicolons): template name, rule name, values to be passed to template, comment, layer names.

Examples of DRC rules expressed in the meta language in the file "demo.table" are as follows (wherein the runset is generated for the native language of the tool HERCULES available from Avant! Corporation):

```
SPACE_AND_NOTCH
---------------
Outputs EXTERNAL command which checks input layer for spacing and notch. Use
this macro to check for notch and spacing errors when notch and spacing
rule are the same value. If the notch rule is different than the spacing rule,
then you need to use both the SPACE and NOTCH macros.
EXAMPLE INPUT:
SPACE_AND_NOTCH, 502, 0.60, "M1 space to M1 >= $value", METAL1
EXAMPLE HERCULES OUTPUT:
/*** CODE FRAGMENT GENERATED BY MACRO "SPACE_AND_NOTCH" ***/
EXTERNAL METAL1 {
  COMMENT = "502: M1 space to M1 >= 0.60"
  SPACING < 0.60
  TOUCH
  NON_PARALLEL
  CHECK_SAME_POLYGON
} (8;254)
SPACE_AND_NOTCH_RUNLENGTH
---------------
Outputs EXTERNAL command which checks input layer for a minimum spacing and
notch, as well as a spacing and notch for long run lengths. Use this macro
to check for notch errors when notch and spacing rule are the same value. If
the notch rule is different than the spacing rule, then you need to use both
the SPACE_RUNLENGTH and NOTCH_RUNLENGTH macros.
EXAMPLE INPUT:
SPACE_AND_NOTCH_RUNLENGTH, 1_5_a, minVal=0.4;longVal=0.9;run=0.65, \
  "POLY space to POLY (run <= $run) >= $minVal (run > $run) >= $longVal", \
  POLY
EXAMPLE HERCULES OUTPUT:
/*** CODE FRAGMENT GENERATED BY MACRO "SPACE_AND_NOTCH_RUNLENGTH"
***/
/*** CODE FRAGMENT GENERATED BY MACRO "SPACE_RUNLENGTH" ***/
EXTERNAL POLY {
  COMMENT = "1_5_a: POLY space to POLY (run <= 0.65) >= 0.4 (run > 0.65) >= 0.9"
  SPACING < 0.4
  LONGEDGE > 0.65
  LONGEDGE_TO_EDGE < 0.9
  TOUCH
  NON_PARALLEL
} (226;5)
/*** CODE FRAGMENT GENERATED BY MACRO "NOTCH_RUNLENGTH" ***/
NOTCH POLY {
  COMMENT = "1_5_a: POLY space to POLY (run <= 0.65) >= 0.4 (run > 0.65) >= 0.9"
  SPACING < 0.4
  LONGEDGE > 0.65
  LONGEDGE_TO_EDGE < 0.9
  TOUCH
  NON_PARALLEL
} (226;5)
WIDTH
-----
Outputs INTERNAL command which checks input layer for a minimum width.
EXAMPLE INPUT:
```

-continued

```
WIDTH, 50, 0.60, "ACT width >= $value (silicide)", ACT
EXAMPLE HERCULES OUTPUT:
/*** CODE FRAGMENT GENERATED BY MACRO "WIDTH" ***/
INTERNAL ACT {
  COMMENT = "50; ACT width >= 0.60 (silicide)"
  SPACING < 0.60
  NON_PARALLEL
} (1;256)
```

In addition, commands to the verification tool itself can be included in such a meta runset 111, as illustrated by file "demo.table" in Appendix A, and that are described below:

%assign_layer
----------
Assign a name to a physical layer.
EXAMPLE:
```
%assign_layer    ACTIVE      (1;0)
%assign_layer    POLY   (2;0)
%assign_layer    NWELL (5;0)
HERCULES OUTPUT:
ASSIGN {
   POLY (2;0)
   NWELL (5;0)
   ACTIVE (1;0)
}
```
%derived_layer
--------------
Create a logical layer from previously defined layers.
EXAMPLE:
```
%derived_layer nactive     NOT(ACTIVE,PPLUS)
HERCULES OUTPUT:
BOOLEAN ACTIVE NOT PPLUS TEMP= nactive
```
%error_layer
----------
Change the output error layer to use for the next rule definition in the meta-language file.
EXAMPLE:
```
%error_layer 226
WIDTH, 50, 0.60, "ACT width >= $value (silicide)", ACT
HERCULES OUTPUT:
/*** CODE FRAGMENT GENERATED BY MACRO "WIDTH" ***/
INTERNAL ACT {
  COMMENT = "50: ACT width >= 0.60 (silicide)"
  SPACING < 0.60
  NON_PARALLEL
} (226;0)
```
%error_datatype
---------------
Change the output error datatype to use for the next rule definition in the meta-language file.
EXAMPLE:
```
%error_datatype 14
WIDTH, 50, 0.60, " ACT width >= $value (silicide)", ACT
HERCULES OUTPUT:
/*** CODE FRAGMENT GENERATED BY MACRO "WIDTH" ***/
INTERNAL ACT {
  COMMENT = "50: ACT width >= 0.60 (silicide)"
  SPACING < 0.60
  NON_PARALLEL
} (226;14)
```
%variable
---------
Create a meta-variable with an assigned value that may be used layer in the meta-language file.
EXAMPLE:
```
@define LIBAR_LONG(leveled_libar,min_area,libar_long)\
AREA leveled_libar {\
   CELL_LEVEL RANGE = [ min_area + DELTA , INFINITY ] \
} TEMP= libar_long
%variable 175    0.50
%variable libar_long 20.0
%derived_layer libar_long LIBAR_LONG(lvl_LIBAR,$libar_long*$175)
HERCULES OUTPUT:
AREA lvl_LIBAR {
   CELL_LEVEL RANGE = [ 20.0*0.50 + 0.001 , 999999999 ]
} TEMP= libar_long
```
%quote
------
Copy the remainder of the line to the runset being written.
EXAMPLE:

-continued

```
%quote /* The following rule is under review and subject to change . . . */
HERCULES OUTPUT:
/* The following rule is under review and subject to change . . . */
```

Expanded rule table 403 is obtained by inserting a line containing a command (e.g."@include macro library") to include an appropriate library of templates that has been previously identified by the user. A custom library of templates 113 (e.g. see the file "demo.macros" in Appendix A), if defined by the user, is also included at this time in expanded rule table 403. Moreover, layer definitions 402 that are common to all runsets, e.g. as defined in files "assign layers" and "derived_layers" in Appendix A, are also included in expanded rule table 403.

Figures 1, 4B:
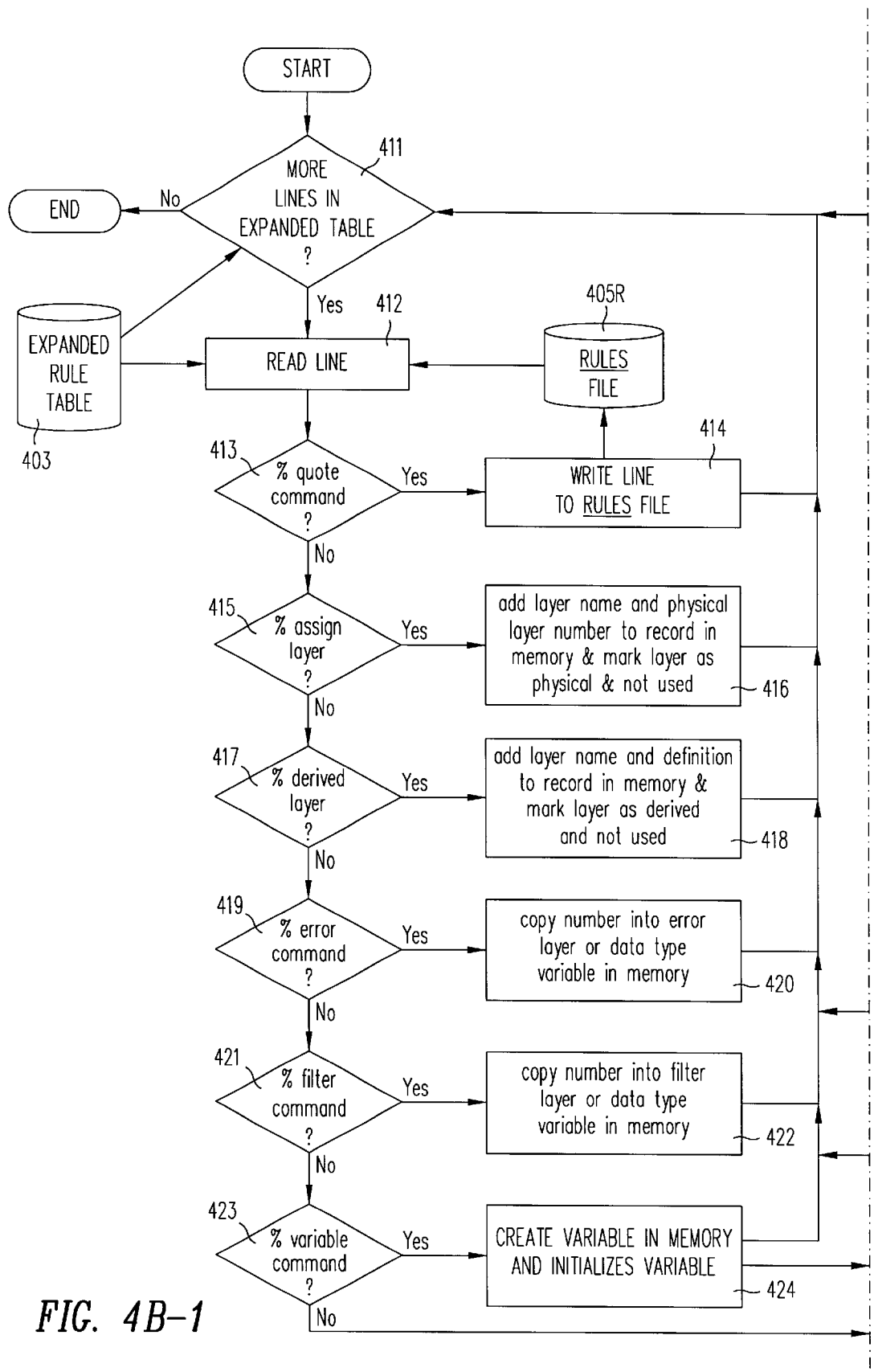
FIGS. 4B (consisting of FIGS. 4B-1 and 4B-2) and 4C illustrate, in a low level flow chart, act performed in the implementation illustrated in FIG. 4A.

Next, runset generator 121 invokes a procedure 404 (e.g. see file "aries.pl" in Appendix A) to process the lines in the expanded rule table 403 for the above-described just-in-time layer derivation, and definition of unique error layers and filter layers. An example implementation of procedure 404 is described below in reference to FIGS. 4B and 4C. Procedure 404 generates two intermediate files 405A and 405R that respectively relate to layers and rules and that are respectively illustrated in Appendix A by the files:

AriesCode/src/modules/demo/CMOS1/demo_61m_1tm.assignand

AriesCode/src/modules/demo/CMOS1/demo_61m_1tm.rules.

Then, runset generator 121 invokes a utility "gcpp" which is a modified version of the above-described "cpp" tool, wherein the source code has been modified to process commands starting with the "@" sign instead of the "#" sign. Utility "gcpp" uses the templates in macro library 122K (invoked by statement "@include" that was inserted by act 401 into expanded rule table 403), thereby to implement act 205 discussed above in reference to FIG. 2. Utility "gcpp" generates an expanded rules file 407 of the type illustrated in Appendix A by the file:

AriesCode/src/modules/demo/CMOS1/demo_61m_1tm.rules_exp.

Thereafter, runset generator 121 invokes a cleanup procedure 408 as illustrated by an "awk" script (of the type illustrated in Appendix A by the file AriesCode/src/clean_runset), with the expanded rules file 407 as input. The awk script removes extra blank lines and "@-" that appear at the beginning of lines containing runset code, thereby to provide as output the DRC runset 150 (e.g. see files with extension ".drc" and ".ev" in Appendix A). Note that in an alternative implementation, files 405A and 405R are directly used, when the verification tool, such as HERCULES version 98.4 includes the capability to process macro calls (e.g. includes a built-in "gcpp" software, or other such preprocessor).

In one implemenation, procedure 404 (illustrated by file "aries.pl" in Appendix A) checks in act 411 if there are more lines to be processed in expanded rules table 403, and ends if there are no more lines. If there is a line to be processed, procedure 404 reads the line in act 412, and thereafter parses the read line as follows. If the line contains a "% quote" token (see act 413) which is used to indicate text to be copied directly into the rules file 405R, procedure 404 writes (see act 414) the line out into rules file 405R.

If the line contains a "% assign" token (see act 415) which is used to indicate the physical layer number of a layer to be formed in the integrated circuit, procedure 404 stores the information in a record in memory (see act 416), and also marks the record as containing a physical layer that has not yet been used in a DRC rule (note that such marking can be accomplished in a default manner, e.g. if the values of such marking are "0" which is the default value in an initialized record; and in such a case no extra acts need be performed to "mark" the record).

In a similar manner, if the line contains a "% derived" token (see act 417) which is used to indicate the layer is derived from logical operations on one or more other layers, procedure 404 stores the information in a record in memory (see act 418), and also marks the record as containing a derived layer that has not yet been used in a DRC rule.

Note that the above-discussed record for a layer may include a first field for holding a name of the layer, a second field for holding a flag indicating whether the layer has been "used," and a third field for holding another flag indicating whether the layer is a physical layer to be formed in an integrated circuit or a derived layer. If the layer is a physical layer the record can include a fourth field for holding a number indicating the physical position of the layer in a set of layers to be formed in an integrated circuit. If the layer is a derived layer the record can include a fourth field for holding an instruction that performs at least one logical operation on at least one other layer.

If the line contains a "% error" token (see act 419) which is used to indicate the layer number of an error layer to be used by the layout verification tool 123K to report errors, procedure 404 updates the specified value in an appropriate variable in memory (see act 420). Note that there are two types of "% error" tokens in this implementation ("% error_layer" and "% error_datatype"), and the respectively appropriate variables are updated with the values provided by the user. Note further that procedure 404 uses the user-specified values only for error layers for the next DRC rule, and identifies a number of additional error layers for subsequent DRC rules by incrementing these values by one for each DRC rule.

In a similar manner, if the line contains a "% filter" token (see act 421) which is used to indicate the layer number of a filter layer (used as described elsewhere herein), procedure 404 again updates the specified value in an appropriate variable in memory (see act 422).

If the line contains a "% variable" token (see act 423) which is used to indicate a variable to be used later in the expanded rules file 403, procedure 404 creates (see act 424) a variable with the specified value in memory for subsequent substitution when the variable is later encountered in 403. Such substitution can occur in of, for example, acts 416, 418, 420, 422, 428 and 431.

If the line contains a "@command" token (see act 425) which is used to indicate a command to the "gcpp" utility, procedure 404 writes (in act 426) the entire line into rules file 405R.

If the line contains one of the following tokens: "REDUNDANT", "TBD", "DEFERRED_NODAL" or "RECOMMENDED", these tokens are handled as special macros (see act 427), by simply writing (see act 428) the appropriate macro call to rules file 405R. These macros are illustrated in appendix A by the file: AriesCode/common/rmacros.

Note that after each of acts 414, 416, 418, 420, 422, 424, 426 and 428, procedure 404 simply returns to act 411 (described above). In act 427, if none of the special macro tokens are found, then the line contains a DRC rule, that is processed in acts 429–432 as follows.

Figure 4C:
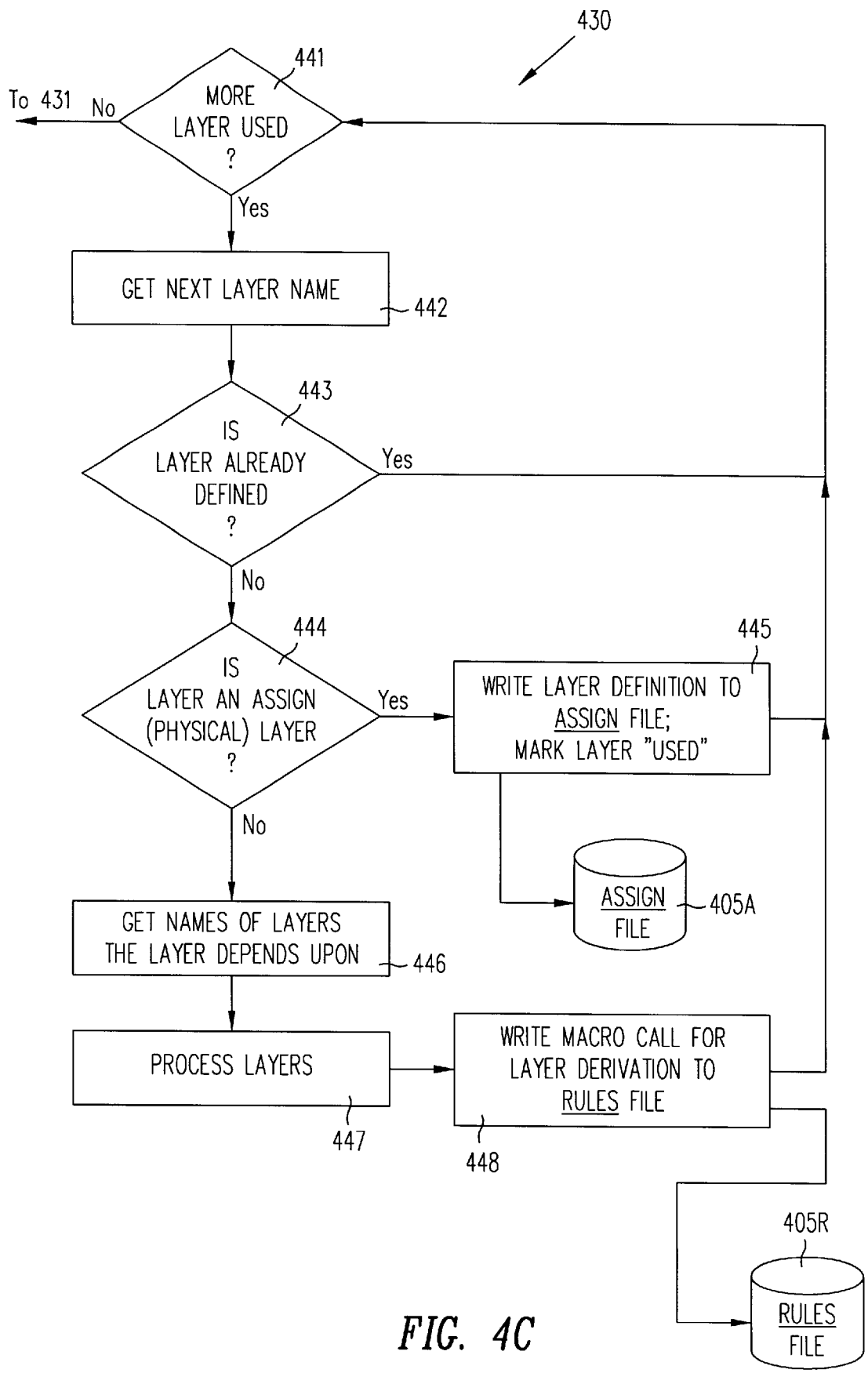

In act 429, procedure 404 parses the line to find the layer names used in the DRC rule, and goes to act 430. In act 430, procedure 404 defines (by writing a layer definition into assign file 405A) any layers that are identified in the DRC rule but are marked as not used, and thereafter marks these layer as used, thereby to implement just-in-time layer definition (therefore, in this implementation, both physical layers and derived layers are defined in a just-in-time manner, although in another implementation, only the derived layers could be defined in the just-in-time manner). Note that act 430 can be implemented as illustrated in FIG. 4C (described below).

Next, procedure 404 uses the two values (e.g. layer value and datatype value) for the error layer and the two values for the filter layer, to write (see act 431) the DRC rule to rules file 405R. Then procedure 404 increments (in act 432) a value for the error layer and a value for the filter layer, for use writing the next DRC rule, and returns to act 411 (described above).

As noted above, act 430 can be implemented by an act 441 wherein if there are no more layers to be processed, procedure 404 goes to act 431 (described above), and otherwise goes to act 442. In act 442, procedure 404 gets the next layer's name and goes to act 443 to check if the layer is already defined (e.g. by searching for the record and on finding the record, checking if the layer is marked as "used;" note that such records can be implemented as an associative array as shown by variables "assign_layers" and "derived_layers" in appendix A in file AriesCode/src/aries.pl.

If layer was previously defined, procedure 404 returns to act 441 (described above). If not defined, procedure 404 goes to act 444 to check (e.g. in the record which was marked as described above in reference to acts 416 and 418), if the layer is a physical layer. If the layer is a physical layer, procedure 404 goes to act 445 and writes a definition for the layer to the assign file 405A. If the layer is a derived layer, procedure 404 gets the names of all layers that the derived layer uses (e.g. from information stored in the record in act 418 as described above), and goes to act 447.

In act 447, procedure 404 recursively performs the acts illustrated in FIG. 4C by starting at act 441 with the layers used to define the derived layer. Once all layers identified in act 446 have been defined by the recursive process, procedure 404 goes to act 448 to write a layer derivation into rules file 405R. In this implementation, the layer derivation is written as a call to a macro defined in the template library 122K (see FIG. 4A; described above), although in other implementations, the actual native code for verification tool 123K can be written directly. Thereafter, procedure 404 returns to act 441 to process any remaining layers.

In another implementation, the runset generator includes an interactive tool containing a Tcl interpreter. Tcl (Tool Command Language) is a public domain scripting language. Through Tcl, the runset generator has a complete shell-like interface and powerful scripting capabilities. Commands have been added to the language to support operations specific to the runset generator. In this implementation, the meta runset can be maintained in text files that are processed by Tcl. In their simplest form these files are merely Tcl scripts containing calls to templates in the library. However, the entire Tcl language is available for developing custom flows and methodologies.

Benefits of using Tcl include: Tcl supplies the runset generator with a complete, powerful, industry-standard shell interface and scripting language enabling the development of custom flows and methodologies. Moreover, the meta runset is independent of verification and layout tools and languages, thereby relieving user of the problems associated with maintaining interfaces to potentially changing environments. Also, the meta runset is easily portable among platforms (due to the public availability of Tcl), and can be directly accessed by independent software that may be prepared by the user.

Therefore, use of a runset generator to translate DRC rules from a meta language into the native language as described herein has the following advantages: reuses code in the native language by use of pre-built DRC templates, reduces development time, simplifies review effort (only review DRC templates, and DRC rules in the meta language, not runsets in the native language), improves consistency, quality, and maintainability, supports regression methodology, tool/language independent, performs/enables runset optimization, just-in-time layer definition, allows user to define rule ordering, focuses expert resources, allows custom DRC templates to be written and integrated into the runset generator when necessary, enables wider use of novice resources, expertise with a particular DRC verification tool is not required, resources with limited knowledge of native language can be effective runset coders.

As noted above, in one embodiment, DRC rules and operations are entered through a graphical user interface (GUI) form, and each DRC rule is "tagged" in the graphical document. For example, a simple spacing rule is illustrated in the GUI form as two shapes with an arrow between them. The arrow is tagged with the spacing value, and this value is extracted and used to create a rule in the native language. This approach is good for visualizing DRC rules in a graphic form.

In one implementation, the runset generator's graphical user interface uses the Tk (Tcl's gui tool-kit) library and thus the runset generator supports Tk calls as part of the Tcl interface. Benefits of using Tk include: graphics eases the learning curve for novice users who are unfamiliar with the runset generator, Tk enables users to create custom graphics that interface with the runset generator and support custom flows and methodologies. Such an approach allows the user to generate, test, and maintain consistent, high-quality runsets in a timely manner with limited resources and expertise.

Numerous modifications and adaptations of the embodiments and implementations described herein will be apparent to the skilled artisan in view of the enclosed disclosure. For example, instead of using C or C++, the DRC templates can be written in any language. Moreover, instead of defining a layer by writing a name of a template into a file for later expansion, a layer can be defined by (1) writing an instruction for defining the layer, in a native language of the layout verification tool or (2) making a function call to a library of functions, a majority of functions in the library writing at least one instruction in the native language. Furthermore, software of a runset generator can be integrated into the layout verification tool, so that the act of defining a layer may include allocating memory for holding information related to the layer, and subsequent to the "allocating" and prior to defining another layer, such software checks if a layout conforms to the DRC rule.

Various such modifications and adaptations are encompassed by the attached claims.

What is claimed is:

1. A method for automatically generating a group of design rule check (DRC) rules to be used by a layout verification tool to verify the design of an integrated circuit, the method comprising:

searching a computer memory for a layer used in a DRC rule; and if the layer is flagged not used in a record found during the searching, defining the layer and flagging in the record, that the whole layer is used.

2. The method of claim 1 wherein:

the act of defining the layer includes writing a name of a template into a file, the template having at least one instruction in a native language of the layout verification tool.

3. The method of claim 1 wherein:

the act of defining the layer includes writing an instruction for defining the layer, in a native language of the layout verification tool.

4. The method of claim 3 further comprising, prior to the act of writing:

making a function call to a library of functions, a majority of functions in the library writing at least one instruction in the native language.

5. The method of claim 1 wherein:

the act of defining the layer includes allocating memory for holding information related to the layer; and the method further comprises, subsequent to the allocating and prior to defining another layer, writing an instruction in a native language for checking if a layout conforms to the DRC rule.

6. The method of claim 1 further comprising, prior to the searching:

creating the record; and marking, in the record, that the layer is not used.

7. A method for automatically generating a group of design rule check (DRC) rules to be used by a layout verification tool to verify a design of an integrated circuit, the method comprising:

marking as used, a layer on which a DRC rule is to be applied, if the layer is marked not used;

generating at least one instruction, in a native language of the layout verification tool, to be applied to the layer; and using the layout verification tool to check if the design conforms to the DRC rule.

8. The method of claim 7 wherein the act of generating includes:

specifying for the DRC rule a unique number of an error layer to be used by the layout verification tool to indicate failure of a design to conform to the DRC rule applied to the layer.

9. The method of claim 8 wherein the act of generating further includes:

specifying for the DRC rule a unique number of a filter layer to be logically operated with the error layer to uniquely identify the failure.

10. The method of claim 7 further comprising:

creating the record; and marking, in the record, that the layer is not used.

11. The method of claim 7 further comprising, prior to the marking:

writing an instruction for defining the layer, in a native language of a verification tool.

12. The method of claim 7 further comprising:

writing a name of a template into a file, the template having at least one instruction in a native language of a verification tool.

13. A computer programmed to perform the method of claim 7.

14. The computer of claim 13 wherein a memory in the computer comprises a plurality of records, each record comprising a first field identifying a layer and a second field indicating if the layer is used.

15. The computer of claim 14 wherein a processor in the computer is programmed to search the memory for the layer.

16. The method of claim 7 further comprising:

searching in a computer memory for the layer; and defining the layer if the layer is marked not used in a record found during searchingly.

17. The method of claim 7 further comprising:

receiving information related to the DRC rule from a user, the information comprising the name of a template, at least one layer on which the DRC rule is to be applied, and values to be used in applying the DRC rule.

18. The method of claim 17 further comprising:

searching in a computer memory for the template having the name that is received from the user.

19. The method of claim 17 wherein:

the receiving of information from the user is performed through a graphical user interface.

20. The method of claim 17 wherein:

the receiving of information from the user is performed through a file in a meta language.

21. The method of claim 17 wherein:

the template is dynamically loaded at runtime.

22. The method of claim 7 wherein:

the act of generating is performed a plurality of times for generation of a corresponding plurality of DRC rules using a single DRC template that is fixed.

23. The method of claim 7 further comprising:

defining a layer if the layer is unused;

wherein the act of defining the layer is performed immediately prior to generation of least one instruction, in a native language of the layout verification tool, to be applied to the layer.

* * * * *

UNITED STATES PATENT AND TRADEMARK OFFICE
CERTIFICATE OF CORRECTION

PATENT NO. : 6,611,946 B1
DATED : August 26, 2003
INVENTOR(S) : Richardson et al.

It is certified that error appears in the above-identified patent and that said Letters Patent is hereby corrected as shown below:

Column 16,
Line 26, "record found during searchingly" should be -- record found during searching --.

Signed and Sealed this

Fifteenth Day of June, 2004

JON W. DUDAS
*Acting Director of the United States Patent and Trademark Office*